(12) United States Patent
Yanagishima et al.

(10) Patent No.: US 7,835,122 B2
(45) Date of Patent: Nov. 16, 2010

(54) SEMICONDUCTOR INTEGRATED CIRCUIT DEVICE

(75) Inventors: Daiki Yanagishima, Kyoto (JP); Masanori Tsuchihashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 514 days.

(21) Appl. No.: 11/917,532

(22) PCT Filed: Jun. 20, 2006

(86) PCT No.: PCT/JP2006/312331

§ 371 (c)(1),
(2), (4) Date: Dec. 14, 2007

(87) PCT Pub. No.: WO2007/000916

PCT Pub. Date: Jan. 4, 2007

(65) Prior Publication Data
US 2009/0128967 A1 May 21, 2009

(30) Foreign Application Priority Data
Jun. 29, 2005 (JP) .............................. 2005-190226

(51) Int. Cl.
H02H 9/00 (2006.01)
(52) U.S. Cl. ........................................................ 361/56
(58) Field of Classification Search .................... 361/56
See application file for complete search history.

(56) References Cited

U.S. PATENT DOCUMENTS

| | | | |
|---|---|---|---|
| 5,661,420 A | * | 8/1997 | Killion et al. ................. 327/29 |
| 6,169,418 B1 | * | 1/2001 | Wagner ........................ 326/41 |
| 6,417,718 B1 | | 7/2002 | Ota |
| 7,285,846 B1 | * | 10/2007 | Tran ........................... 257/667 |

FOREIGN PATENT DOCUMENTS

| | | |
|---|---|---|
| JP | 05-190371 | 7/1993 |
| JP | 05-226585 | 9/1993 |
| JP | 07-274575 | 10/1995 |
| JP | 08-019284 | 1/1996 |
| JP | 2001-185680 | 7/2001 |

* cited by examiner

Primary Examiner—Stephen W Jackson
(74) Attorney, Agent, or Firm—Fish & Richardson P.C.

(57) ABSTRACT

A semiconductor integrated circuit device comprises a first terminal (denoted by VCC) connected to a power supply in a normally mounted state, a second terminal (denoted by SB) connected to a signal line in the normally mounted state and to a power supply in a reversely mounted state, a third terminal (denoted by SGND) connected to the ground in the normally mounted state, fourth terminals (denoted by HU−, HW−) connected to the signal line in the normally mounted state and to the ground in the reversely mounted state, electrostatic protective diodes (denoted by D1, D6) having anodes connected to the third terminal and cathodes connected to the fourth terminals and serving as means for protecting the fourth terminal in the normally mounted state, a current control resistor (R1) having one end connected to the second terminal and serving as means for preventing the second terminal from being broken in the reversely mounted state, a Zener diode (ZD) having an anode connected to the third terminal and a cathode connected to the other end of the current control resistor (R1). With this, destruction of the semiconductor integrated circuit device when it is reversely mounted onto a board or into a slot is prevented without providing any redundant external terminal.

3 Claims, 2 Drawing Sheets

SEMICONDUCTOR INTEGRATED CIRCUIT DEVICE

TECHNICAL FIELD

The present invention relates to a semiconductor integrated circuit device, and in particular to preventing its breakage when it is reversely mounted onto a board or into a slot.

In the present specification, the expression "reversed mounting" is assumed to denote not only erroneously mounting a semiconductor integrated circuit device in an orientation 180° rotated from its correct mounting orientation about the line normal to and passing through the center of the top surface of the semiconductor integrated circuit device but also erroneously mounting it in an orientation 90° or 270° rotated from its correct mounting orientation.

BACKGROUND ART

If a semiconductor integrated circuit device is reversely mounted onto a board or into a slot, an unintended external conductor is connected to each of its external terminals. In particular, if, on reverse mounting, an external terminal is unintendedly connected to a power source line, and it has a low withstand voltage (e.g., if the external terminal is a logic signal input terminal), a large current may flow through an internal element connected to that external terminal, resulting in breakage of or heat generation in the semiconductor integrated circuit device.

To cope with such reversed mounting, there have conventionally been disclosed and proposed a semiconductor integrated circuit device on which an identification mark indicating the correct mounting orientation is attached or impressed, a semiconductor integrated circuit device whose external terminals have such a special shape to prevent reversed mounting, and a semiconductor integrated circuit device having external terminals of particular functions (power source terminals, ground terminals, and signal input/output terminals) provided each in a pair and having these arranged in diagonal positions on the package (see, for example, Patent Publications 1 and 2).

| Patent Publication 1 | JP-A-H05-190371 |
| Patent Publication 2 | JP-A-H05-226585 |

DISCLOSURE OF THE INVENTION

Problems to be Solved by the Invention

It is true that, with a semiconductor integrated circuit device adopting the conventional technology according to Patent Publication 1 or 2 mentioned above, even if it is reversely mounted onto a board or into a socket, no breakage of an internal element is invited, and thus the semiconductor integrated circuit device can operate normally.

However, the conventional technologies according to Patent Publications 1 and 2 are difficult to adopt unless a semiconductor integrated circuit device has an ample number of external terminals. That is, in a semiconductor integrated circuit device (e.g., in a polygon mirror motor driver IC) in which the number of external terminals is required to be reduced as much as possible in order to reduce the mounting space, it is avoided to provide redundant terminals, and therefore it is difficult to adopt the conventional configurations described above.

A simpler way to cope with the reversed mounting of a semiconductor integrated circuit device is to reserve as a non-connection terminal the external terminal which will be connected to a power source line when the device is reversely mounted. However, for the same reason as described above, this is not necessarily a suitable way of coping with the reversed mounting of a semiconductor integrated circuit device in which the number of external terminals is required to be reduced.

An object of the present invention is to provide a semiconductor integrated circuit device that can be prevented from breakage when it is reversely mounted onto a board or into a slot without requiring the provision of a redundant external terminal.

Means for Solving the Problem

To achieve the above described object, according to the present invention, a semiconductor integrated circuit device includes: as means for electrical connection with outside the device, at least a first external terminal that is connected to a power source line when the device is normally mounted; a second external terminal that is connected to a predetermined signal line when the device is normally mounted and that is connected to the power source line when the device is reversely mounted; a third external terminal that is connected to a ground line when the device is normally mounted; and a fourth external terminal that is connected to a predetermined signal line when the device is normally mounted and that is connected to the ground line when the device is reversely mounted, and, as electrostatic protection means for protecting the fourth external terminal when the device is normally mounted, an electrostatic protection diode an anode of which is connected to the third external terminal and a cathode of which is connected to the fourth external terminal. Here, the semiconductor integrated circuit device further includes, as means for preventing breakage of the second external terminal when the device is reversely mounted, a current control resistor one end of which is connected to the second external terminal, and a Zener diode an anode of which is connected to the third external terminal and a cathode of which is connected to another end of the current control resistor (first configuration).

According to the present invention, in the semiconductor integrated circuit device having the first configuration, it is preferable that the second external terminal be an external terminal for input/output of a logic signal (second configuration).

According to the present invention, it is preferable that the semiconductor integrated circuit device having the second configuration be a motor drive device for controlling driving of a motor, and that the second external terminal be an external terminal for receiving any one of: a signal for choosing either applying or not applying a short brake; a signal for choosing either a first or a second excitation angle as an excitation angle of the motor; a signal for choosing either forward or reverse rotation of the motor; a signal for choosing either upper-side or lower-side PWM control; a signal for choosing either performing or not performing bootstrapping; a signal for choosing either a first pulse number or a second pulse number as a number of control pulses; and a signal for choosing either performing or not performing PWM synchronous rectification (third configuration).

ADVANTAGES OF THE INVENTION

With a semiconductor integrated circuit device of the present invention, it is possible, without providing a redundant external terminal, to prevent breakage when the semiconductor integrated circuit device is reversely mounted onto a board or into a slot.

Figure 1:
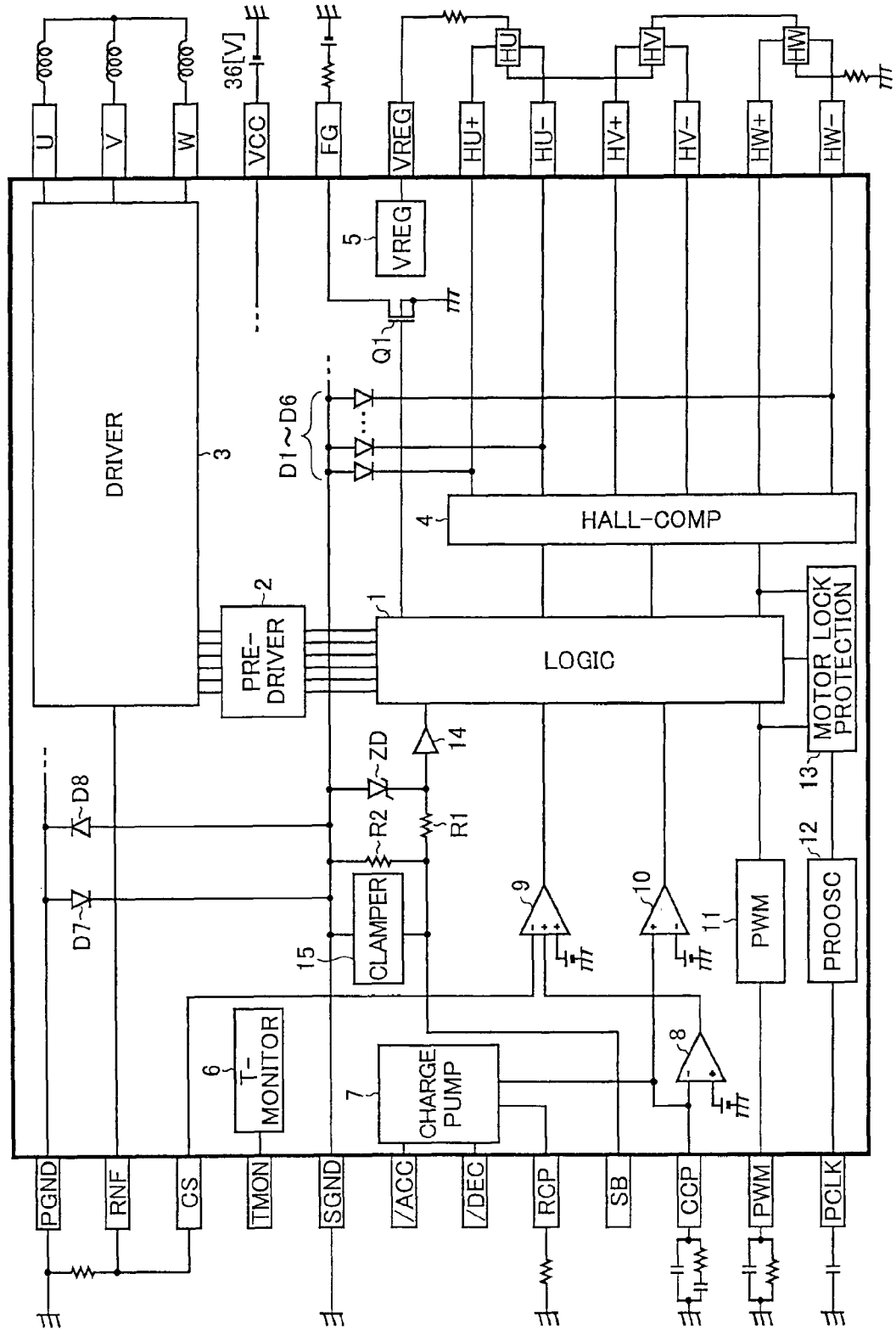
[FIG. 1] is a diagram showing a semiconductor integrated circuit device of the present invention when it is normally mounted.

LIST OF REFERENCE SYMBOLS 1 logic circuit
2 pre-driver
3 driver
4 Hall comparator
5 regulator
6 temperature monitoring circuit
7 charge pump
8 torque amplifier
9 comparator
10 comparator
11 PWM signal generating circuit
12 oscillator circuit
13 motor-lock protection circuit
14 buffer
15 damper
D1-D8 electrostatic protection diodes
R1 current control resistor
R2 resistor
ZD Zener diode
Q1 transistor

BEST MODE FOR CARRYING OUT THE INVENTION

The following description discusses examples of how the present invention is applied to a motor driver IC that controls driving of a motor (more specifically, for example, a polygon mirror motor driver IC in which the number of external terminals is required to be reduced as much as possible).

FIG. 1 is a diagram showing a semiconductor integrated circuit device of the present invention when it is normally mounted. As shown in the figure, the semiconductor integrated circuit device of this embodiment has, as means for electrical connection with outside the device, 24 external terminals PGND, RNF, CS, TJMON, SGND, /ACC, /DEC, RCP, SB, CCP, PWM, PROCLK, HW−, HW+, HV−, HV+, HU−, HU+, VREG, FG, VCC, W, V, and U, with 12 of them arranged at each of opposite edges of the package. The semiconductor integrated circuit device of this embodiment has, as internal circuit blocks thereof, a logic circuit 1, a pre-driver 2, a driver 3, a Hall comparator 4, a regulator 5, a temperature monitoring circuit 6, a charge pump 7, a torque amplifier 8, comparators 9 and 10, a PWM signal generating circuit 11, an oscillator circuit 12, a motor-lock protection circuit 13, a buffer 14, and a damper 15. The semiconductor integrated circuit device of this embodiment has, as internal circuit elements thereof, electrostatic protection diodes D1-D8, resistors R1 and R 2, a Zener diode ZD, and a transistor Q1.

The PGND terminal (a pin-1) is an external terminal for connecting the ground terminal of the power-handling circuit portion (such as the pre-driver 2 and the driver 3) to a ground line outside the device.

The RNF terminal (a pin-2) is an external terminal for leading a drive current flowing through a power transistor (not shown) provided in the driver 3 to a ground line via an externally connected sense resistor (having a resistance of about several hundred mΩ).

The CS terminal (a pin-3) is an external terminal for receiving the terminal voltage of the sense resistor in order to detect the drive current of the power transistor.

The TJMON terminal (a pin-4, denoted by TMON in the figure) is an external terminal for outputting a temperature monitoring signal obtained from the temperature monitoring circuit 6 to outside the device.

The SGND terminal (a pin-5) is an external terminal for connecting the ground terminal of the signal-handling circuit portion (such as the logic circuit 1) to a ground line located outside the device, and is connected to that ground line when the device is normally mounted. That is, the SGND terminal corresponds to the "third external terminal" in the claims of the present application.

The /ACC terminal (a pin-6) and the /DEC terminal (a pin-7) are external terminals for receiving output control signals for the charge pump 7 from outside the device to achieve speed control in a servo system. The servo signals fed to these external terminals are high-speed logic signals ready for response requirements of the order of 40 ns.

The RCP terminal (a pin-8) is an external terminal for connecting an external resistor (output current setting means) to the charge pump 7.

The SB terminal (a pin-9) is an external terminal for receiving, from outside the device, a logic signal for choosing whether or not to apply a short brake. The short brake is a brake mechanism in which all the upper power transistors or all the lower power transistors provided in the driver 3 are brought into a conducting state so that a motor is stopped by use of the electric power generated by the motor itself. When the device is reversely mounted, the SB terminal is connected to the power source line (see FIG. 2). That is, the SB terminal corresponds to the "second terminal" in the claims of the present application.

The CCP terminal (a pin-10) is an external terminal for connecting a charge-discharge circuit (means for generating a torque control signal) to the output terminal of the charge pump 7.

The PWM (pulse width modulation) terminal (a pin-11) is an external terminal for connecting an external resistor and an external capacitor (means for adjusting the waveform of a PWM signal) to the PWM signal generating circuit 11.

The PROCLK terminal (a pin-12, denoted by PCLK in the figure) is an external terminal for connecting an external capacity (oscillation frequency setting means) to the oscillator circuit 12.

The HU+ terminal (a pin-18), the HU-terminal (a pin-17), the HV+ terminal (a pin-16), the HV− terminal (a pin-15), the HW+ terminal (a pin-14), and the HW− terminal (a pin-13) are external terminals for receiving Hall signals of different phases from external three-phase Hall elements HIU, HV, and HW. Of all these external terminals, the HU− terminal and the HW− terminal are, when the semiconductor integrated circuit device is reversely mounted, connected to a ground line located outside the device (see FIG. 2). That is, the HU− terminal and the HW− terminal correspond to the "fourth external terminal" in the claims of the present application.

The VREG terminal (a pin-19) is an external terminal for outputting a constant voltage generated by the regulator circuit 5 as the power source voltage for the Hall elements of the different phases.

The FG terminal (a pin-20) is an external terminal for outputting a control pulse (an FG pulse) to outside the semiconductor integrated circuit device.

The VCC terminal (a pin-21) is an external terminal for receiving electric power from a power source line located outside the device, and is connected to that power source line when the semiconductor integrated circuit device is normally mounted. That is, the VCC terminal corresponds to the "first external terminal" in the claims of the present application. As an input voltage, a high voltage (e.g., 36 V at the maximum) is applied to the VCC terminal, and therefore this terminal is designed to have a high withstand voltage.

The U, V, and W terminals (a pin-24, a pin-23, and a pin-22) are external terminals for supplying drive signals to three-phase (U-, V-, and W-phase) motor coils provided in the motor. As the drive signals, high voltages are applied to these external terminals, and therefore these terminals are designed to have high withstand voltages.

The logic circuit 1 is means for centrally controlling the overall operation of the semiconductor integrated circuit device (constant-speed drive control and phase control of the motor based on the phase-by-phase output signals of the Hall comparator 4, constant-current drive control of the motor based on a comparison output of the comparator 9, torque control of the motor based on a comparison output of the comparator 10, control pulse output control by use of the transistor Q1, various kinds of circuit protection control, etc.). More specifically, to achieve the constant-speed drive control and the phase control of the motor, the logic circuit 1, while performing feedback control of the rotation speed and the phase of the motor according to the output signals of the different phases outputted from the Hall comparator 4, generates pre-drive signals (uh, ul, vh, vl, wh, and wl) for the different phases of the motor, and feeds the pre-drive signals to the pre-driver 2.

The pre-driver 2 is means for shifting the levels of and adjusting the waveforms of the pre-drive signals (uh, ul, vh, vl, wh, and wl) fed thereto from the logic circuit 1 to thereby generate drive signals (UH, UL, VH, VL, WH, and WL) for the different phases of the motor, and feeding the drive signals to the driver 3.

The driver 3 is means for driving the motor using power transistors (not shown) connected in an H-bridge. The power transistors are on-off controlled according to the drive signals (UH, UL, VH, VL, WH, and WL) fed to the gates thereof, and drive the motor externally connected to the U, V, and W terminals.

The Hall comparator 4 is means for comparing the positive and negative sinusoidal Hall signals of each phase applied to the HU+ terminal, the HU− terminal, the HV+ terminal, the HV− terminal, the HW+ terminal, and the HW− terminal to thereby generate output signals of the different phases having rectangular waveforms, and feeding the output signals of the different phases to the logic circuit 1.

The regulator 5 is voltage conversion means for generating a desired output voltage from an input voltage applied to the VCC terminal, and outputting the generated output voltage from the VREG terminal as the power source voltage for the Hall elements of the different phases.

The temperature monitoring circuit 6 is means for generating a temperature monitoring signal commensurate with the chip temperature of the semiconductor integrated circuit device, and outputting the temperature monitoring signal to the outside of the semiconductor integrated circuit device via the TJMON terminal.

The charge pump 7 is means for generating an output current commensurate with servo signals fed to the /ACC and /DEC terminals, and feeding the output current to the charge-discharge circuit externally connected to the CCP terminal. That is, at the CCP terminal, a torque control voltage (a charge-discharge voltage) that varies with the output current of the charge pump 7 is obtained.

The torque amplifier 8 is means for amplifying the differential voltage between the torque control voltage obtained from the CCP terminal and a predetermined reference voltage, and outputting the resulting voltage.

The comparator 9 is means for comparing the output voltage of the torque amplifier 8 or a predetermined reference voltage with the terminal voltage of the sense resistor fed to the CS terminal (a monitoring voltage commensurate with the drive current of the power transistors), and feeding the comparison output to the logic circuit 1.

The comparator 10 is means for comparing the torque control voltage obtained from the CCP terminal with a predetermined reference voltage, and feeding the comparison output to the logic circuit 1.

The PWM signal generating circuit 11 is means for generating a PWM signal commensurate with the resistance and capacitance of an external resistor and an external capacitor connected to the PWM terminal, and feeding the PWM signal to the logic circuit 1.

The oscillator circuit 12 is means for generating, according to an external capacitor connected to the PROCLK terminal, a clock signal having a predetermined oscillation frequency, and feeding the clock signal to the motor-lock protection circuit 13.

The motor-lock protection circuit 13 is means for detecting whether or not the motor is locked, and instructing, when it finds the motor to be locked, the logic circuit 1 to stop the motor.

The buffer 14 is means for buffering the logic signal fed to the SB terminal, and feeding the logic signal to the logic circuit 1.

The damper 15 is one of electrostatic protection means of the SB terminal and is provided with a function of clamping the terminal voltage of the SB terminal at a predetermined value when a surge voltage is applied to the SB terminal. The clamp voltage of a logic terminal is typically set about twice as high as the voltage that is normally applied to the logic terminal (e.g., about 10 V when the voltage that is normally applied to the logic terminal is 5V) so that the above-described clamp operation can be securely performed when a surge voltage is applied. However, the clamp voltage of the damper 15 of this embodiment is set higher (e.g., 48 V) than described above. With such a design, even if the semiconductor integrated circuit device is reversely mounted and a high voltage (36 V at the maximum) is applied from the power source line to the SB terminal, the breakage of the damper 15 can be avoided.

In the semiconductor integrated circuit device of this embodiment, in which the clamp voltage is set higher than is typical as described above, later-described breakage preventing means (i.e., the current control resistor R1 and the Zener diode ZD) functioning as such when the semiconductor integrated circuit device is reversely mounted also functions as electrostatic protection means when the semiconductor integrated circuit device is normally mounted. Thus, even when the surge voltage applied to the SB terminal is not so high as to trigger the damper 15, the input terminal potential of the buffer 14 does not rise excessively. Therefore, the clamp voltage set higher than is typical does not cause any particular inconveniences.

The electrostatic protection diodes D1 to D6 are electrostatic protection means whose anodes are all connected to the SGND terminal and whose cathodes are connected to the Hall input terminals (HU+, HU−, HV+, HV−, HW+, and HW− terminals), respectively. With these electrostatic protection diodes D1 to D6 so inserted, when the device is normally mounted, even if a surge voltage is applied to the Hall input terminals, the surge voltages can be diverted via the electrostatic protection diodes D1 to D6 to the SGND terminal (thus, to the ground line), and thus the breakage of an internal element can be prevented.

The electrostatic protection diodes D7 and D8 are connected in parallel with and in opposite directions to each other between the PGND terminal and the SGND terminal. With these electrostatic protection diodes D7 and D8 so inserted, when the device is normally mounted, even if a surge voltage is applied to one of the GND terminals, the surge voltage can be diverted via the electrostatic protection diodes D7 and D8 to the other of the GND terminals (thus, to a ground line), and thus the breakage of an internal element can be prevented.

The current control resistor R1 is a high-resistance element (having a resistance of about 50 kΩ) whose one end is connected to the SB terminal and whose other end is connected to the input terminal of the buffer 14, and as will be described later, the current control resistor R1 functions as breakage preventing means for preventing the breakage of the SB terminal when the device is reversely mounted.

The resistor R2 is a high-resistance element (having a resistance of about 100 kΩ, that is, a resistance about twice as high as that of the current control resistor R1) whose one end is connected to the SB terminal and whose other end is connected to the SGND terminal. When the semiconductor integrated circuit device is normally mounted, the resistor R2 operates more dominantly than the current control resistor R1, and functions as means for maintaining the voltage level of the SB terminal at a predetermined level (i.e., 5 to 5.5 V).

The Zener diode ZD is a constant-voltage diode whose anode is connected to the SGND terminal and whose cathode is connected to the other end of the current control resistor R1 (the input terminal of the buffer 14). As will be described later, the Zener diode ZD functions as breakage preventing means for preventing the breakage of the SB terminal when the device is reversely mounted.

The transistor Q1 is an open-drain N-channel field effect transistor. Through gate control (switching control) by the logic circuit 1, by use of the transistor Q1, the FG signal is generated (its logic level is shifted).

Next, with reference to FIG. 2, the case will be described in detail where the semiconductor integrated circuit device having the above described configuration is reversely mounted onto a board or into a slot.

Figure 2:
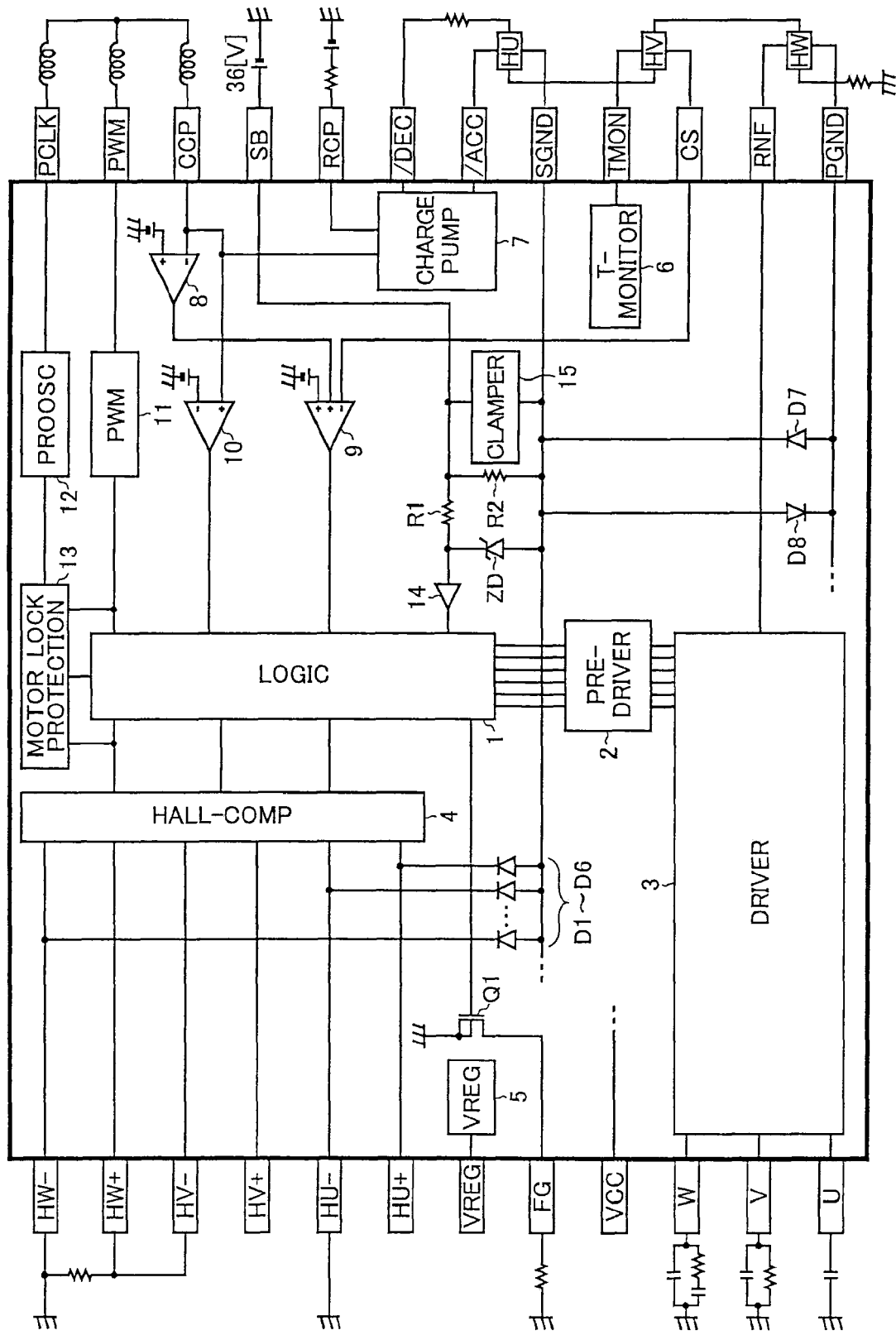
[FIG. 2] is a diagram showing the semiconductor integrated circuit device of the present invention when it is reversely mounted.

FIG. 2 is a diagram showing the semiconductor integrated circuit device of the present invention when it is reversely mounted. As has already been described, when the semiconductor integrated circuit device is reversely mounted, what is at the highest risk of being involved in the breakage of an internal element is the SB terminal, because it is then unintendedly connected to the power source line.

Accordingly, as breakage preventing means when the semiconductor integrated circuit device is reversely mounted, the current control resistor R1 and the Zener diode ZD, both described previously, are inserted for the SB terminal of this embodiment. With this configuration, even when the device is reversely mounted onto a board or into a socket and a high voltage (36 V at the maximum) is applied to the SB terminal from the power source line, the current that thence flows in is diverged via the current control resistor R1, the Zener diode ZD, and the electrostatic protection diodes D2 and D6 to the HU− terminal and the HW− terminal (i.e., the external terminals that are unintendedly connected to a ground line).

At this time, the input voltage fed to the logic circuit 1 (i.e., the input terminal voltage of the buffer 14) is clamped by the Zener diode ZD at a predetermined level (e.g., about the same level as when the device is normally mounted, i.e., 5 to 5.5 V).

Also, at this time, the current that flows through the SB terminal is controlled by the current control resistor R1 so that the value of the current is not too large. More specifically, when it is assumed that the voltage applied to the SB terminal is 36 V, that the clamp voltage by the Zener diode ZD (i.e., the Zener voltage) is 5.5 V, that the forward drop voltage of the electrostatic protection diodes D2 and D6 is 0.6 V, and that the resistance of the current control resistor R1 is 50 kΩ, then the current I that flows through the SB terminal is controlled to be as minute as 59.8 µA (a current value at which no breakage of an internal element occurs) as given by the equation: I=(36 V−5.5 V−0.6 V)/50 kΩ.

As has been described above, in the semiconductor integrated circuit device of this embodiment, by connecting the current control resistor R1 and the Zener diode ZD for the SB terminal, which is unintendedly connected to the power source line when the semiconductor integrated circuit device is reversely mounted, the impedance of the SB terminal with respect to the power source line and the ground line is increased and at the same time no high voltage is applied to the logic circuit 1. With this configuration, it is possible, without providing a redundant external terminal, to prevent breakage on reversed mounting onto a board or into a slot.

In the embodiment described above, it is assumed that the present invention is applied to a motor driver IC, but this is not meant to limit the configuration of the present invention in any manner; in practice, the present invention is widely applicable to semiconductor integrated circuit devices in general (e.g., regulator ICs) provided with a high-withstand-voltage terminal.

The embodiment described above deals with a semiconductor integrated circuit device in which equal numbers of external terminals are arranged at each of opposite edges of its package (so-called dual in-line package), but this is not meant to limit the application of the present invention in any manner, and the present invention naturally applies to a semiconductor integrated circuit device having external terminals arranged at all the four edges of the package thereof.

It should be understood that the present invention may be carried out in any manner other than specifically described above as an embodiment, and many modifications and variations are possible within the scope and spirit of the present invention.

For example, in the embodiment described above, it is assumed that the SB terminal is placed in a terminal position where it is connected to a power source line when the device is reversely mounted, but this is not meant to limit the configuration of the present invention in any manner, but instead of that external terminal, there may be placed an external terminal for receiving any one of the following signals: a signal for choosing either 120° or 150° as the excitation angle of the motor, a signal for choosing either forward or reverse rotation of the motor, a signal for choosing either upper-side or lower-side PWM control, a signal for choosing either performing or not performing bootstrapping, a signal for choosing either 6 or 12 as the number of FG pulses, and a signal for choosing either performing or not performing PWM synchronous rectification.

In other words, in a terminal position where the terminal placed therein is connected to a power source line when the device is reversely mounted, any external terminal may be placed with which various changes in properties (changes in operation speed, input offset, input impedance, etc.) that may accompany the above described measures against breakage on reversed mounting (i.e., insertion of the current control resistor R1 and the Zener diode ZD) do not disturb the normal operation of the device in its normally mounted state, for example, an external terminal for the input/output of a logic signal that is not required to have a very fast response.

INDUSTRIAL APPLICABILITY

The present invention offers a technology that is useful for preventing breakage of a semiconductor integrated circuit device when it is reversely mounted, and that is particularly useful in semiconductor integrated circuit devices in which the number of external terminals is required to be reduced as much as possible (e.g., a polygon mirror motor driver IC).

The invention claimed is:

1. A semiconductor integrated circuit device, comprising:
as means for electrical connection with outside the device, at least
a first external terminal that is connected to a power source line when the device is normally mounted;
a second external terminal that is connected to a predetermined signal line when the device is normally mounted and that is connected to the power source line when the device is reversely mounted;
a third external terminal that is connected to a ground line when the device is normally mounted; and
a fourth external terminal that is connected to a predetermined signal line when the device is normally mounted and that is connected to the ground line when the device is reversely mounted, and
as electrostatic protection means for protecting the fourth external terminal when the device is normally mounted, an electrostatic protection diode an anode of which is connected to the third external terminal and a cathode of which is connected to the fourth external terminal, wherein
the semiconductor integrated circuit device further includes:
as means for preventing breakage of the second external terminal when the device is reversely mounted,
a current control resistor one end of which is connected to the second external terminal; and
a Zener diode an anode of which is connected to the third external terminal and a cathode of which is connected to another end of the current control resistor.

2. The semiconductor integrated circuit device of claim 1, wherein the second external terminal is an external terminal for input/output of a logic signal.

3. The semiconductor integrated circuit device of claim 2, wherein
the semiconductor integrated circuit device is a motor drive device for controlling driving of a motor, and
the second external terminal is an external terminal for receiving any one of: a signal for choosing either applying or not applying a short brake; a signal for choosing either a first or a second excitation angle as an excitation angle of the motor; a signal for choosing either forward or reverse rotation of the motor; a signal for choosing either upper-side or lower-side PWM control; a signal for choosing either performing or not performing bootstrapping; a signal for choosing either a first or a second pulse number as a number of control pulses; and a signal for choosing either performing or not performing PWM synchronous rectification.

* * * * *